United States Patent [19]

Hartmann et al.

[11] 3,961,293

[45] June 1, 1976

[54] MULTI-RESONANT SURFACE WAVE RESONATOR

[75] Inventors: Clinton S. Hartmann, Richardson; Jeffrey Stuart Schoenwald, Dallas, both of Tex.

[73] Assignee: Texas Instruments Incorporated, Dallas, Tex.

[22] Filed: Feb. 3, 1975

[21] Appl. No.: 546,358

[52] U.S. Cl. .................................. 333/72; 310/8.2; 310/9.8
[51] Int. Cl.² .................... H03H 9/02; H03H 9/20; H03H 9/26; H03H 9/32
[58] Field of Search ............... 333/30 R, 72; 310/8, 310/8.1, 8.2, 9.7, 9.8

[56] References Cited
UNITED STATES PATENTS

| | | |
|---|---|---|
| 3,716,809 | 2/1973 | Reeder et al. .................. 333/30 R X |
| 3,781,717 | 12/1973 | Kuenemund ..................... 333/72 X |
| 3,882,430 | 5/1975 | Maerfeld ......................... 333/30 R |
| 3,886,504 | 5/1975 | Hartmann et al. ................ 333/72 |

Primary Examiner—Alfred E. Smith
Assistant Examiner—Marvin Nussbaum
Attorney, Agent, or Firm—Harold Levine; James T. Comfort; William E. Hiller

[57] ABSTRACT

A surface wave device having a periodic frequency response characteristic is disclosed. At least two reflective grating structures are located at the surface of the surface wave device such that acoustic surface wave standing wave resonance can occur in the region between the two reflector structures. The spacing between the reflector structures is sufficiently large to insure that standing wave resonance can occur at any of a plurality of discrete resonance frequencies, all falling within the bandwidth of the grating reflectors themselves.

19 Claims, 6 Drawing Figures

MULTI-RESONANT SURFACE WAVE RESONATOR

This invention relates to acoustic surface wave resonator devices and more particularly to resonator devices having a plurality of discrete resonance frequencies.

There are many applications for electrical filters having frequency response characteristics which include a plurality of narrow passband regions separated by intervening bandstop regions. Such devices, for example, find application in electrical synthesizers. Another application is disclosed in U.S. patent application Ser. No. 347,106, filed Apr. 2, 1973 and assigned to the assignee of the present invention. It has been discovered recently that such desirable frequency responses can be realized conveniently with a surface wave device (SWD). An SWD having this type of frequency response is disclosed in the aforementioned U.S. patent application Ser. No. 347,106. Briefly, these devices consist first of a substrate of piezoelectric material such as quartz, lithium niobate, zinc oxide or cadmium sulfide or thin films of piezoelectric materials on non-piezoelectric substrates, such as zinc oxide on silicon. Formed thereon is an input transducer for the purpose of converting input electrical energy to acoustical energy within the substrate. This acoustical energy propagates down the substrate to the area of a second output transducer which performs the function of converting the acoustical energy to an electrical output signal. The input and output transducers frequently comprise interdigital transducers well known to those skilled in the art. Interdigital transducers may be formed by depositing thin films of electrically conductive material, such as aluminum or gold and patterning the thin film into an appropriate structure. Electrical potentials coupled to the input interdigital transducers induce mechanical stresses in the piezoelectric substrate. The resultant strains propagate along the surface of the substrate away from the input interdigital transducer in the form of surface waves, such as the well known Rayleigh waves or Love waves. These propagating strains arrive at the output interdigital transducer where they are converted to output electrical signals. A frequency response characteristic is associated with both the conversion of electrical to acoustical energy by the input interdigital transducer and with the conversion of acoustical to electrical energy by the output interdigital transducer. The nature of these frequency response characteristics is determined by the specific configuration of the transducer themselves. In particular, it is possible to configure the transducers such that the overall frequency response characteristic of the SWD includes a plurality of very narrow passbands separated by frequency bands of high attenuation.

One of the salient advantages of these SWD filters is their relatively small size. It will be recognized by those skilled in the art, however, that, to a first approximation, the bandwidth of any of the individual passbands in the frequency response characteristic is inversely proportional to the length of one or both of the interdigital transducers. Accordingly, efforts to increase the sharpness of these individual passbands must necessarily involve increase in the size of at least one of the interdigital transducers and consequent increase in the size of the SWD itself. In some cases the requirements placed on the frequency response characteristic are so severe as to result in an SWD which is unacceptably large.

The realization of a frequency response characteristic having a plurality of very sharp passbands while still maintaining the characteristic small size of SWDs is made possible by the improved SWD of the present invention. Briefly, the device may be fabricated on an acoustic wave propagating substrate preferably of a piezoelectric material such as those previously mentioned. Coupling means are provided for converting an external electrical signal to acoustic waves propagating along the substrate. This means may typically comprise an interdigital transducer. Also formed on the surface of the substrate are at least two acoustic wave reflectors. In the preferred embodiment each of these reflectors comprises a reflective grating structure. These reflectors are positioned so that acoustic surface waves propagating along that portion of the substrate intermediate to the reflectors will be reflected back and forth between the reflectors. At certain frequencies these reflected acoustic surface waves can result in a standing wave resonance pattern in a manner analogous to the well known cavity resonators. An SWD resonator of the type described to this point is disclosed in U.S. patent application Ser. No. 471,616, filed May 20, 1974, now U.S. Pat. No. 3,886,504 issued May 27, 1975.

Typically, the reflectors employed in SWD resonators are designed to be effective at a single frequency. As a practical matter, however, the reflectors will reflect waves efficiently over some small range of frequencies. Typical reflective grating structures, for example, will effectively reflect over a bandwidth comprising about one percent of the design center frequency. It is possible, therefore, for standing wave resonance to occur not only at the design center frequency but at any frequency falling within this bandpass of the reflectors themselves. In accordance with the present invention the spacing between the reflectors is selected such that standing wave resonance can occur only at a set of discrete frequencies falling within the bandpass of the reflectors. These discrete frequencies may be referred to as the modes of the device.

In some applications the only external connection to the SWD resonator is made at the already mentioned input transducer. In such a case the device simply provides a driving point impedance which varies as a function of frequency. If the device is to be used as a bandpass filter or in some other applications, an output transducer is provided to convert resonant acoustic energy to an electrical signal.

As a further aspect of the present invention it is noted that the placement of the input transducer relative to the reflectors may be used to determine which of the modes of the SWD resonator will be excited. Similarly, placement of the output transducer, if one is included, will determine which of the modes can be coupled out of the device.

It is therefore an object of the present invention to provide a device having an electrical driving point impedance of high amplitude in a plurality of very narrow frequency bands and relatively low amplitude at other frequencies.

It is another object of the present invention to provide a filter with a plurality of very narrow passbands separated by frequency regions of low transmission.

It is a further object of the invention to provide the aforementioned objects with a device having small physical dimensions.

It is still another object of the invention to provide the aforementioned objects with improved SWD resonator devices.

Other objects and features of the invention will be made clear by a consideration of the following detailed description taken in conjunction with the drawings wherein.

Figure 1:
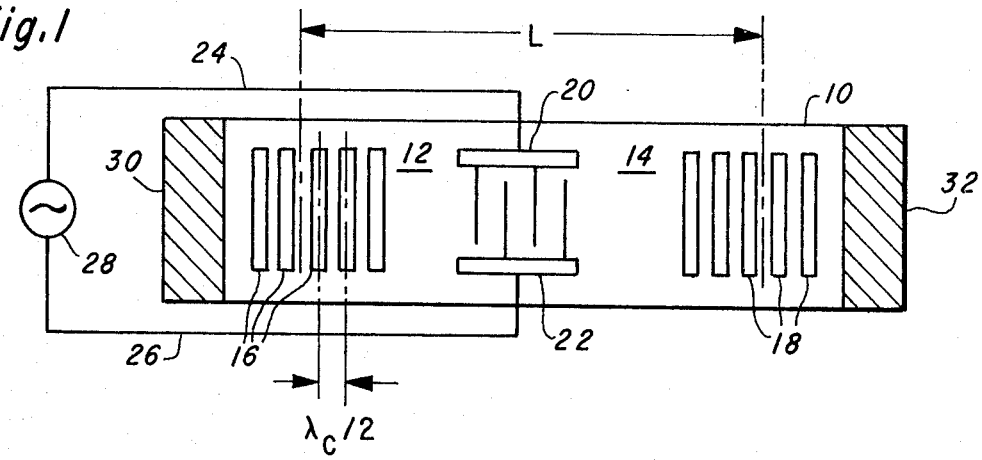
FIG. 1 illustrates a one-port embodiment of the invention.

Referring to FIG. 1, there is illustrated one embodiment of an SWD resonator in accordance with the present invention. The SWD comprises a substrate 10 of piezoelectric material such as lithium niobate or quartz. First and second reflective grating structures 12 and 14 are provided on the substrate 10, the reflective grating structures 12, 14 comprising respective pluralities of discontinuities 16 and 18. The discontinuities 16, 18 are formed at the suface of substrate 10 so as to be capable of reflecting at least a portion of any surface waves incident thereon.

The discontinuities 16 and 18 of the grating structures 12 and 14 may be formed as a plurality of narrow thin film fingers or bars deposited on the surface of substrate 10. The bars may be formed of an electrically conductive material such as gold, copper or aluminum. Alternatively, they may be formed of a dielectric material such as silicon oxide, silicon nitride or zinc oxide, for example. As another alternative the reflecting discontinuities 16 and 18 may be formed by selectively etching portions of the surface of substrate 10. In still another alternative the strips may be comprised of any material which, when deposited on the substrate surface, will vary the mass loading of the surface. While for purposes of illustration each of grating structures 12 and 14 is illustrated as having 5 discontinuity elements, it will be understood that many more such elements may be incorporated in the grating structures, 100 being a typical number, to enhance the total percentage of reflection of acoustic surface waves incident to the grating structures 12 and 14.

Also formed on the surface of substrate 10 is a surface wave transducer comprised of electrodes 20 and 22. As shown in FIG. 1 the surface wave transducer in the preferred embodiment is of the interdigital type. While each of electrodes 20 and 22 in FIG. 1 is illustrated as having two fingers, it is possible for each electrode to have but a single finger or alternatively to have a large number of fingers, the specific choice being dictated by the application. The electrodes 20 and 22 may be formed of a suitably patterned thin film electrically conductive material, such as gold, copper or aluminum. The interdigital transducer is coupled by means of lines 24 and 26 to a source of electrical excitation 28. The extremities of substrate 10 may be suitably treated so as to effect the absorption of any surface waves incident thereon, thereby preventing the reflection of surface waves from the extremities of substrate 10. Such treatment may comprise deposition of an absorptive material at the surface of the substrate 10 in areas at the opposite ends thereof. In this respect, the end portions 30 and 32 of the substrate define respective surface wave absorption areas.

Operationally, electrical energy provided by source 28 is converted by the interdigital transducer to acoustic surface wave energy propagating along the surface of substrate 10. As these propagating surface waves reach the discontinuity elements 16 and 18 of the grating structures 12 and 14 they will be at least partially reflected by each of the discontinuity elements. The individual reflective discontinuities 16 and 18 of each of the grating structures 12 and 14 are equally spaced with the distance between centers of adjacent discontinuities being equal to one-half wavelength at the center frequency of the resonator device, this wavelength being designated in FIG. 1 as $\lambda_c$. As a result, the waves reflected from the various discontinuity elements 16 and 18 of the respective grating structures 12 and 14 will reinforce in a coherent manner for waves with a wavelength near $\lambda_c$. If a suitable number of reflective discontinuities are provided, almost total reflection of the incident acoustic waveform will occur. While the reflective grating structures 12 and 14 are designed to reflect only those waves at a frequency $f_c$ corresponding to wavelength $\lambda_c$, those skilled in the art will recognize that practical reflective grating structures will effectively reflect any wave having a frequency which falls within some small band centered about $f_c$. If reflective grating structures 12 and 14, for example, each have approximately 100 discontinuity elements the width of this small band of frequencies may typically be one percent of $f_c$. One condition for the existence of a standing wave resonance pattern in the area of the substrate between reflective grating structure 12 and 14 is that the frequency of the standing wave resonance must fall within this small band of frequencies which can be effectively reflected by reflective grating structures 12 and 14.

A second condition must also be satisfied to insure that the structure can support standing wave resonance at the desired frequencies. This condition is that the distance between the effective centers of reflection of reflective grating structures 12 and 14, designated as L in FIG. 1, must be approximately an integral number of half wavelengths at the desired frequency of the standing wave resonance. This condition is expressed by the equation:

$$L = \lambda_N (N/2 - \theta_r/360) \qquad (1)$$

L = distance between effective centers of reflection of the reflective grating structures;

$\lambda_N$ = wavelength of surface waves at the frequency of the desired standing wave resonance;

N = an integer; and $\theta_r$ = reflection phase angle.

If the frequency $f_N$ corresponding to wavelength $\lambda_N$ falls within the small band of frequencies which can be effectively reflected by reflective grating structures 12 and 14, and if the distance L is such that there exists an integer N for which equation (1) is satisfied, then the structure of FIG. 1 is capable of supporting standing wave resonance at frequency $f_N$. In accordance with the principles of the invention, the distance L is selected so that the above conditions are satisfied for a plurality of discrete frequencies corresponding to a sequence of values of the integer N. The spacing between any adjacent pair of frequencies from this set may be determined with the aid of equation (2).

$$\lambda_N = V/f_N \tag{2}$$

wherein:
V = velocity of surface wave propagation on substrate 10, and
$f_N$ = frequency of waves having wavelength $\lambda_N$.

Equations (1) and (2) may be combined to yield an expression for the frequency $f_N$ as well as for the frequency $f_{N+1}$. The difference between these two frequencies as given by equation (3) is the spacing between adjacent frequencies at which standing wave resonance can occur.

$$f_{N+1} - f_N = (V/L)\{[(N+1)/2] - [\theta_r/360]\} - (V/L)\{[N/2] - [\theta_r/360]\} = V/(2L) \tag{3}$$

The frequency separation between adjacent standing wave resonance frequencies is seen to be the reciprocal of the round trip surface wave travel time from the center of reflection of a first grating reflector to the center of reflection of the second grating reflector and back to the center of reflection of the first grating reflector. In accordance with the principles of the invention the distance L is selected both to determine the discrete frequencies at which standing wave resonance can occur as well as to determine the spacing between any adjacent pair of these frequencies. The region on the surface of substrate 10 in which standing wave resonance can occur will be referred to as a resonant cavity.

Figure 2:
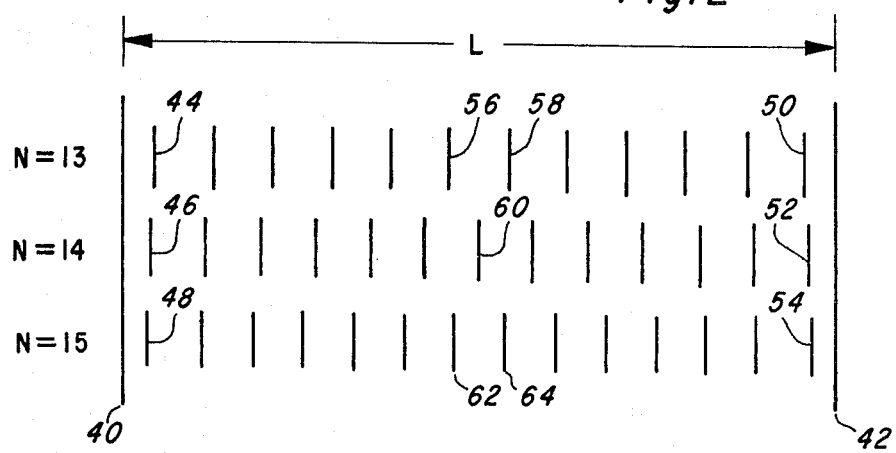
FIG. 2 shows the location of nodes in the resonance pattern for several modes.

In order to insure proper operation of the SWD resonator it is necessary to properly locate the interdigital transducer comprised of electrodes 20 and 22 in FIG. 1. To this end, FIG. 2 is a diagram showing the location, relative to the effective centers of the reflective grating structures, of nodes for standing wave resonance patterns corresponding to three different values of the integer N. The location of the effective center of the first reflective grating structure is indicated by vertical line 40 while the location of the effective center of the second reflective grating structure is indicated by vertical line 42. Just as in FIG. 1 the distance along the substrate between these two effective centers is indicated by L. The uppermost row of short vertical lines indicates the location of the nodes of the standing wave resonance pattern corresponding to N = 13. For purposes of illustration, it has been assumed in FIG. 2 that the value of $\theta_r$ is 180°. It will be understood by those skilled in the art that the mode corresponding to N=13 will be efficiently excited only if the point/points at which the interdigital transducer induces the maximum strain in the surface of substrate 10 corresponds to the location of one or more of the nodes in the standing wave resonance pattern for N=13. In other words, if the maximum strain induced by the interdigital transducer occurs at points midway between adjacent pairs of electrode fingers, then the transducer should be located so that these points coincide with the location of nodes in the standing wave resonance pattern as shown in FIG. 2. Similarly, other modes such as the modes corresponding to N=14 and N=15 will be efficiently excited only if the nodes of the standing wave resonance patterns corresponding to these modes are coincident with points of maximum excitation of the interdigital transducer.

Consideration of FIG. 2 shows that in the region near the effective center of a reflective grating structure, the nodes for all modes occur at almost the same point. Node 44 for N=13, node 46 for N=14, and node 48 for N=15 are seen to occur at virtually the same point. Similar comments apply to nodes 50, 52 and 54 which occur near effective center 42 of the other reflective grating structure. Accordingly, it will be understood that if the interdigital transducer is located in the vicinity of either of the reflective grating structures, and is properly placed to excite one of the modes then this same transducer will be able to excite the other modes.

Considering the location of nodes in the region midway between the effective centers of the two reflective grating structures, however, a different situation is seen to prevail. Comparing the location of nodes 56 and 58 of the N=13 mode, for example, with the location of node 60 for the N=14 mode, it is seen that the location of node 60 is displaced by approximately one-quarter wavelength from the location of nodes 56 and 58. If the interdigital transducer is placed at a point approximately midway between the two reflective grating structures and properly positioned so as to efficiently excite the N=13 mode, then the transducer will be in the worst possible position for exciting the N=14 mode. Considering next the location of nodes of the N=15 mode, nodes 62 and 64, for example, it is seen that these approximately coincide with the locations of nodes 56 and 58 of the N=13 mode. From the preceding discussion it will be seen heuristically that input interdigital transducers located approximately midway between the reflective grating structures are able to efficiently excite only every other mode of the cavity. If the input interdigital transducer, however, is located near one of the reflective grating structures it is possible to efficiently excite all of the modes of the cavity. By suitable choice of position between these extremes different groupings of excited and unexcited modes can be achieved. Also, while the preceeding comments have been directed to excitation of a mode by an input interdigital transducer, corresponding comments are equally applicable to the coupling of modes out of the device by an output interdigital transducer.

The multi-resonator structure illustrated in FIG. 1 comprises one embodiment of the invention. This embodiment, having a single interdigital transducer, provides only one port for connection to external circuitry. The device in this configuration is useful as a circuit element having a frequency dependent driving point impedance.

Figure 3:
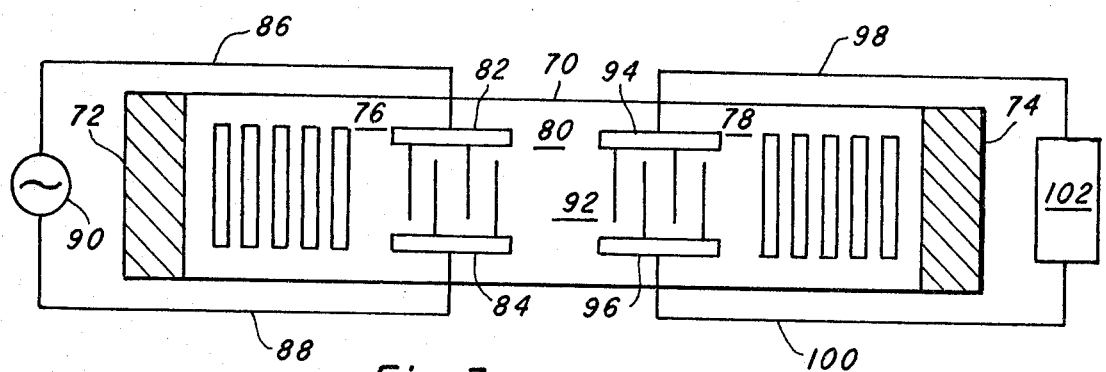
FIG. 3 illustrates a two-port embodiment of the invention.

Another embodiment of the invention is illustrated in FIG. 3. This embodiment is structurally similar in many respects to the embodiment of FIG. 1. It comprises first a substrate 7 preferably of piezoelectric material the extremities of which may optionally be treated for surface wave absorption as at 72 and 74. Reflective grating structures 76 and 78 arranged on the surface of the substrate so as to provide a region therebetween for acoustic surface wave resonance. An input transducer 80, preferably of the interdigital type and comprised of electrodes 82 and 84, is located on the surface of the substrate in a region between the two reflective grating structures 76 and 78. The input transducer is coupled by means of lines 86 and 88 to an external source of electrical excitation 90. An output transducer 92 is comprised of electrodes 94 and 96 and is similarly located on the surface of substrate 70 in the region between reflective grating structures 76 and 78. The output transducer is coupled by means of lines 98 and 100 to an external load 102. Again, reflective grating structures 76 and 78, while being shown as having only five discontinuity elements each, will in general have many more discontinuity elements, 100 being a typical number. The distance between the effective centers of reflection of reflective grating structures 76 and 78 is again selected in accordance with equation (1). The specific configuration of the input and output transducer is optional, it being contemplated that in many applications broadband transducers will be used. Those skilled in the art will recognize that transducers having few interdigital fingers will provide a broadband frequency response for the conversion of electrical energy to acoustic surface wave energy and of acoustic surface wave energy to electrical energy. The location of input transducer 80 relative to reflective grating structures 76 and 78 is selected in accordance with the above teaching so as to efficiently excite only those cavity modes which are desired. Similarly, output transducer 92 is located so as to efficiently couple out only the desired cavity modes.

Figure 4:
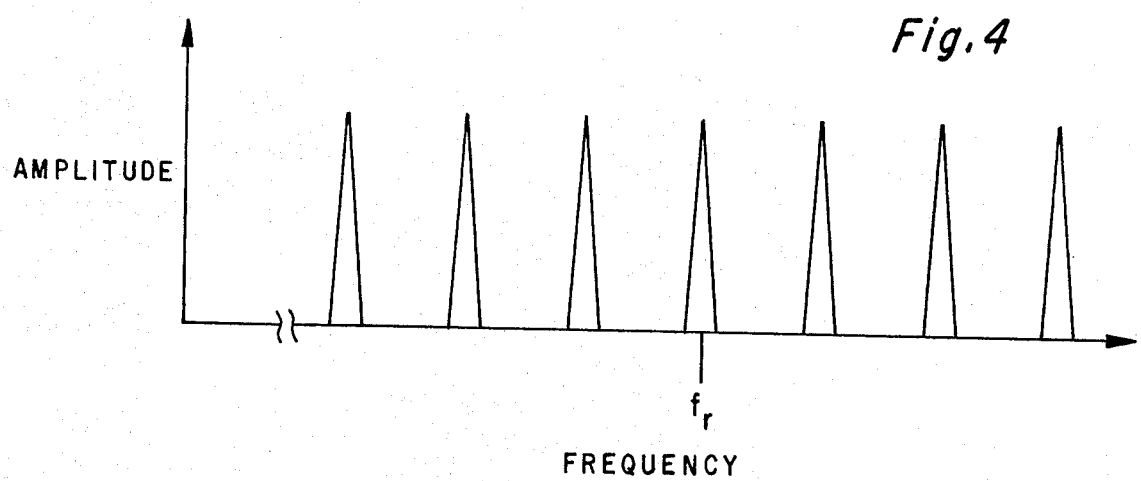
FIG. 4 shows a typical frequency response characteristic for a filter according to the invention.

For the purpose of discussing the operation of the embodiment of FIG. 3, it will be assumed that both input transducer 80 and output transducer 92 are located near one of reflective grating structures 76 and 78 so as to be able to couple all of the modes which can be supported between the reflective grating structures. The frequencies at which these modes occur those corresponding to the wavelengths determined from equation (1) and which also fall within the band of frequencies which can be effectively reflected by reflective grating structures 76 and 78. Accordingly, if one of these frequencies is present in the output of input source 90, a corresponding acoustic surface wave standing wave resonance pattern will be established in the resonator cavity. The energy in this standing wave resonance pattern is coupled out of the resonator by output transducer 92 to external load 102. Thus, when the signal provided by input source 90 is at a frequency corresponding to one of the possible resonance frequencies, this signal is effectively coupled through the resonator to the external load 102 with relatively little attenuation. If the signal provided by input source 90, however, is not at one of the possible resonance frequencies, then little of the energy is coupled through output transducer 92 to load 102 and the signal suffers substantial attenuation in passing through the resonator. It will be seen, therefore, that the embodiment of FIG. 3 comprises a two-port filter having a plurality of very narrow bandpasses as shown in the frequncy response diagram of FIG. 4. The frequency response includes a plurality of very narrow passbands located in the vicinity of frequency $f_r$ which is the frequency that is most effectively reflected by the reflective grating structures 76 and 78.

The frequency distance between any pair of adjacent very narrow passbands is given by equation (3). The sharpness of any given passband, that is its Q, is a function of the effectiveness with which that particular frequency is reflected by the reflective grating structures and of propagation losses at that frequency. While the peak responses of all the passbands in FIG. 4 have been shown to be equal, this will in general not be the case and it may be expected that the peak responses of passbands remote from $f_r$ will be lower than those of passbands near $f_r$.

A typical bandpass filter might have a center frequency $f_r$ of 400 mHz. The distance between adjacent passbands is 0.2 mHz while the half power bandwidth of any given passband is 0.02 mHz. Realization of this type of frequency response with a standard SWD fabricated on an ST quartz substrate would require a substrate length of approximately 12 inches. The SWD resonator of the present invention, however, will provide the same frequency response with a substrate length of only 0.35 inches.

Figure 5:
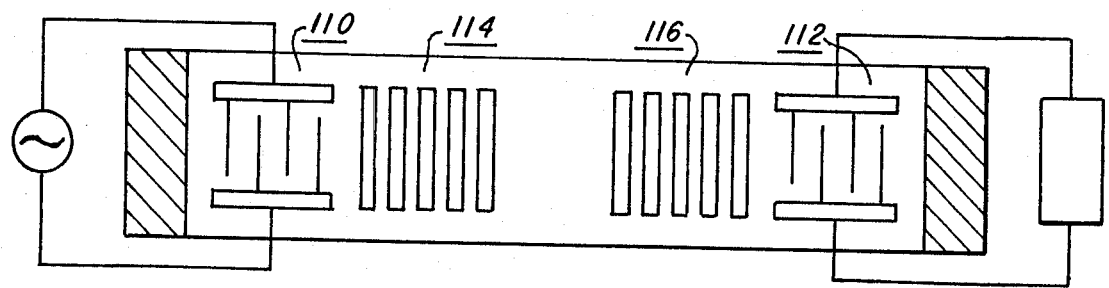
FIG. 5 illustrates placement of the coupling transducers outside the resonant cavity.

Another embodiment of the invention is illustrated in FIG. 5. This embodiment is similar to that illustrated in connection with FIG. 3, the principal difference being the fact that in FIG. 5 the input interdigital transducer 110 and output interdigital transducer 112 are both outside the cavity region defined between reflective grating structures 114 and 116. The relative locations of reflective grating structures 114 and 116 are such that standing wave resonance can occur in the region of the substrate therebetween at a plurality of discrete frequencies. This is insured by placing the reflective grating structure 114 and 116 in accordance with the principles set forth above. While reflective grating structure 114 is a substantial reflector of surface waves having a frequency content within the band of interest, some of the surface wave energy generated by input interdigital transducer 110 in response to signals provided by the external voltage source will leak through reflecting grating structure 114 into the cavity region of the substrate. If these surface waves include energy at any of the resonant frequencies of the cavity, the corresponding standing wave condition will be excited. While the placement of the input interdigital transducer in the structure of FIGS. 1 and 3 relative to the reflective grating structures is critical in terms of exciting certain resonant modes, there is no corresponding restriction on the placement of the input interdigital transducer in the structure of FIG. 5.

If any resonant mode of the cavity is excited by surface wave energy from the input interdigital transducer, a portion of the energy from this resonant mode will leak through reflective grating structure 116 to output interdigital transducer 112 and be converted to an output electrical signal. Just as in the case of input interdigital transducer 110, the placement of output interdigital transducer 112 relative to the reflective grating structures 114 and 116 is not critical. It will be understood by those skilled in the art that the structure of FIG. 5 comprises a multi-resonant bandpass filter and may be used to provide a frequency response of the type illustrated in FIG. 4. Alternatively, the structure of FIG. 5 could be modified by removing therefrom output transducer 112. The remaining structure would then comprise a device for providing a frequency dependent driving point impedance. As such, the device would perform a circuit function similar to that performed by the device of FIG. 1 but would differ structurally from the device of FIG. 1 in that the interdigital transducer would be located outside the resonant cavity.

In some applications it may be highly desirable that the interdigital transducer be placed outside the resonant cavity. If the device is to be used as a precise frequency standard, for example, then it is important to be able to control with some precision the exact location of the resonant peaks in the frequency response of the device. Interdigital transducers located on the surface of the substrate within the resonant cavity itself comprise discontinuities at the propagating surface of the substrate. As such, they may have a tendency to interfere with the standing wave resonance pattern and cause some slight shift in the frequencies of the resonant peaks. This problem does not arise if the interdigital transducers are placed outside the region of the resonant cavity as in the device of FIG. 5. Alternatively, applications will occur to those skilled in the art wherein it will be desirable to have at least one interdigital transducer outside the resonant cavity while at least one other interdigital transducer is located within the resonant cavity.

Figure 6:
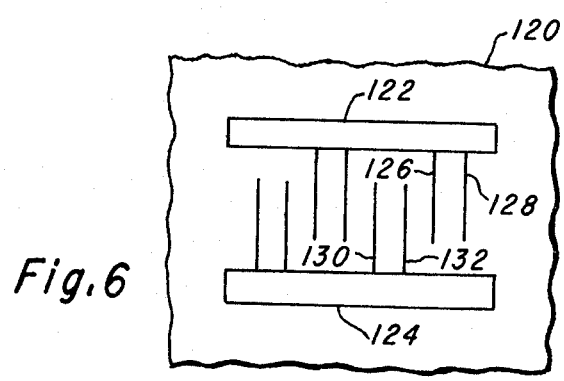
FIG. 6 shows a split finger type interdigital transducer.

In some cases it may be desirable to modify the interdigital transducers used in the various embodiments of the invention. Such a modified transducer is illustrated in FIG. 6 wherein is shown a portion of the substrate surface 120 including a representative interdigital transducer. The transducer is comprised of conductor bars 122 and 124 along with a plurality of interdigital fingers. In the structure of FIG. 6 any pair of adjacent fingers such as fingers 126 and 128 are separated by a distance equal to one quarter wavelength at the dominant frequency of the transducer. Similarly, the spacing between fingers 130 and 132 is one quarter wavelength as is the spacing between fingers 132 and 126. Since fingers 126 and 128 are both electrically connected to conductor strip 122 while fingers 130 and 132 are both electrically connected to conductive strip 124 it will be understood by those skilled in the art that the transducer will couple electrical and acoustic energy in a manner substantially similar to the transducer illustrated in FIGS. 1, 3 and 5. The split finger transducer of FIG. 6, however, substantially reduces the perturbing effect of the transducer on acoustic surface waves propagating along the portion of the substrate wherein is located the transducer. This is particularly significant when the interdigital transducers are to be located in the cavity region of the substrate. Each interdigitated finger constitutes a discontinuity on the surface of the substrate and will have some tendency to reflect incident acoustic wave energy. If the interdigitated fingers are spaced at a distance equal to one-half wavelength at the frequency of the propagating acoustic wave, then the reflections from any two adjacent fingers will add in phase. Accordingly, the reflection from the totality of fingers in an interdigital transducer may add coherently so as to substantially reflect any wave incident thereon. If adjacent fingers are separated by one-quarter wavelength, however, as in the structure of FIG. 6, then reflections from any adjacent pair of fingers will be out of phase. In such a structure, therefore, coherent reflection of incident waveforms does not occur.

In the various embodiments disclosed the reflector structures have both been tuned to the same frequency. In others words, the spacing between adjacent reflector elements as in FIG. 1 is $\lambda_c/2$ for both reflector structures. In some applications it will be desirable to slightly stagger the tuning of the two reflector structures, that is to space adjacent elements of one reflector at a distance slightly different than $\lambda_2/2$. This modification is within the scope of the invention.

There has been disclosed a surface wave device including a resonant cavity wherein standing wave resonance can occur at a plurality of discrete frequencies. Whereas several specific embodiments of the invention have been disclosed, it is to be understood that various changes, substitutions and alterations can be made therein without departing from the spirit and scope of the invention as defined by the appended claims.

What is claimed is:

1. A surface wave multi-resonant device comprising:
 substrate means having at least a surface layer of piezoelectric material,
 acoustic surface wave transducer means disposed on said piezoelectric surface of said substrate means and being operable to convert an input electrical signal to acoustic surface waves propagating on said piezoelectric surface of said substrate means,
 means defining first and second reflective structures on the piezoelectric surface of said substrate means for respectively substantially reflecting acoustic surface waves propagating on the surface of said substrate means,
 said first and second reflective structures being disposed in opposing alignment with respect to each other and being spaced apart to cooperatively define a resonant cavity capable of supporting acoustic surface wave standing wave resonance at a plurality of distinct frequencies falling within the effective reflecting bandpass of said first and second reflective structures, and
 the effective centers of reflection of said first and second reflective structures being separated by a distance L and there being at least two values for the integer N in the equation:

$$L = \lambda[(N/2) - (\theta_r/360)],$$

where
 $\lambda$ is the wavelength of the acoustic surface wave being propagated, and
 $\theta_r$ is the reflection phase angle,
such that at least two values of the wavelength $\theta$ correspond to surface wave frequencies falling within the effective reflecting bandpass of said first and second reflective structures.

2. A multi-resonant device as set forth in claim 1, wherein the frequency separation between adjacent standing wave resonance frequencies of said plurality of distinct frequencies is in accordance with the equation:

$$f_{N+1} - f_N = V/2L,$$

where
 $f_{N+1}$ and $f_N$ are adjacent standing wave resonance frequencies, and $V$ is the velocity of the acoustic surface wave being propagated.

3. A multi-resonant device as set forth in claim 1, wherein said substrate means comprises a substrate made entirely of piezoelectric material.

4. A multi-resonant device as set forth in claim 1, wherein said substrate means comprises a substrate body of non-piezoelectric material, and a layer of piezoelectric material provided on said substrate body and forming said surface of piezoelectric material on which said acoustic surface wave transducer means and said first and second reflective structures are disposed.

5. A multi-resonant device as set forth in claim 1 wherein said acoustic surface wave transducer means comprises at least one interdigital transducer.

6. A multi-resonant device as set forth in claim 5 wherein said first and second reflective structures are located on the piezoelectric surface of said substrate means on opposite sides of said at least one interdigital transducer.

7. A multi-resonant device as set forth in claim 1 wherein said acoustic surface wave transducer means comprises input and output interdigital transducers.

8. A multi-resonant device as set forth in claim 1 wherein each of said reflective structures comprises a plurality of spaced apart discontinuities located at the piezoelectric surface of said substrate means, each of said discontinuities being capable of reflecting at least a portion of the surface wave energy incident thereon.

9. A multi-resonant device as set forth in claim 8 wherein each of said discontinuities comprises a narrow strip of electrically conductive material located at the piezoelectric surface of said substrate means.

10. A multi-resonant device as set forth in claim 8 wherein each of said discontinuities comprises a narrow strip of material located at the piezoelectric surface of said substrate means, the material of each strip being effective to vary the mass loading at said piezoelectric surface in a periodic manner.

11. A multi-resonant device as set forth in claim 8 wherein each of said discontinuities comprises a narrow strip of dielectric material located at the piezoelectric surface of said substrate means.

12. A multi-resonant device as set forth in claim 8 wherein each of said discontinuities comprising a narrow depression formed in the piezoelectric surface of said substrate means.

13. A multi-resonant device as set forth in claim 7 wherein said input and output interdigital transducers are located in the space between said first and second reflective structures on the piezoelectric surface of said substrate means.

14. A multi-resonant device as set forth in claim 7 wherein said input and output interdigital transducers are respectively located outwardly with respect to said first and second reflective structures on the piezoelectric surface of said substrate means so as to be disposed beyond the resonant cavity.

15. A multi-resonant surface wave filter comprising:
substrate means having at least a surface layer of piezoelectric material,
means defining first and second reflective structures on the piezoelectric surface of said substrate means for respectively substantially reflecting acoustic surface waves propagating on the surface of said substrate means and having frequencies falling within a first bandpass,
input and output acoustic surface wave transducer means disposed on said piezoelectric surface of said substrate means, said input transducer means being effective to provide acoustic surface waves propagating on said piezoelectric surface of said substrate means in response to the reception of an input electrical signal, and said output transducer means being effective to provide electrical signals as an output therefrom in response to the reception of acoustic surface waves propagating on said piezoelectric surface of said substrate means,
said first and second reflective structures being disposed in opposing alignment with respect to each other and being spaced apart to cooperatively define a resonant cavity capable of supporting acoustic surface wave standing wave resonance at a plurality of distinct frequencies falling within said first bandpass,
the effective centers of reflection of said first and second reflective structures being separated by a distance $L$ and there being at least two values for the integer $N$ in the equation:

$$L = \lambda[(N/2) - (\theta_r/360)],$$

where
$\lambda$ is the wavelength of the acoustic surface wave being propagated, and
$\theta_r$ is the reflection phase angle,
such that at least two values of the wavelength $\lambda$ correspond to surface wave frequencies falling within said first bandpass, and
said first bandpass containing a plurality of bandpass regions corresponding to said acoustic surface wave standing wave resonance frequencies with successive bandpass regions separated by respective signal attenuation regions to define the frequency response characteristic of the filter.

16. A filter as set forth in claim 15 wherein each of said input and output transducer means respectively comprises an interdigital transducer.

17. A filter as set forth in claim 16, wherein said input and output interdigital transducer are located on the piezoelectric surface of said substrate means between said first and second reflective structures.

18. A filter as set forth in claim 16, wherein said input and output interdigital transducers are respectively located outwardly with respect to said first and second reflective structures on the piezoelectric surface of said substrate means so as to be disposed beyond said resonant cavity.

19. A filter as set forth in claim 15, wherein the frequency separation between adjacent standing wave resonance frequencies of said plurality of distinct frequencies included within said first bandpass is in accordance with the equation:

$$f_{N+1} - f_N = V/2L,$$

where $f_{N+1}$ and $f_N$ are adjacent standing wave resonance frequencies, and $V$ is the velocity of the acoustic surface wave being propagated.

* * * * *